(12) United States Patent
Buller

(10) Patent No.: US 6,967,363 B1
(45) Date of Patent: Nov. 22, 2005

(54) LATERAL DIODE WITH MULTIPLE SPACERS

(75) Inventor: James F. Buller, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 85 days.

(21) Appl. No.: 10/676,904

(22) Filed: Oct. 1, 2003

(51) Int. Cl.[7] .............................................. H01L 29/76
(52) U.S. Cl. ............... 257/288; 257/367; 257/E27.051; 257/E29.195; 257/E29.328; 438/237; 438/FOR 415
(58) Field of Search ................................ 257/288, 367, 257/E27.051, E29.195, E29.328; 438/237, 438/FOR 415

(56) References Cited

U.S. PATENT DOCUMENTS

| | | | | |
|---|---|---|---|---|
| 5,036,017 | A | * | 7/1991 | Noda .......................... 438/179 |
| 5,510,280 | A | * | 4/1996 | Noda .......................... 438/179 |
| 6,074,906 | A | | 6/2000 | Cheek et al. |
| 6,506,642 | B1 | | 1/2003 | Luning et al. |
| 2001/0011744 | A1 | * | 8/2001 | Sung .......................... 257/314 |
| 2005/0035410 | A1 | * | 2/2005 | Yeo et al. ..................... 257/355 |

OTHER PUBLICATIONS

Dallas Semiconductor; *Compensating for Ideality Factor and Series Resistance Differences between Thermal Sense Diodes*; www.maxim-ic.com/an1057; Apr. 17, 2002; pp. 1-2.

Intel; *Intel Pentium® III Processor, Thermal Diode*; http://support.intel.com/support/processors/pentiumiii/sb/CS-007590.htm; Aug. 12, 2003; pp. 1-3.

* cited by examiner

*Primary Examiner*—George Fourson
*Assistant Examiner*—Thanh V. Pham
(74) *Attorney, Agent, or Firm*—Timothy M. Honeycut

(57) ABSTRACT

Various circuit devices, including diodes, and methods manufacturing therefor are provided. In one aspect, a method manufacturing is provided that includes forming a gate structure on a semiconductor portion of a substrate. The semiconductor portion has a first conductivity type. First and spacer structures are formed on opposite sides of the gate structure. A first impurity region of a second conductivity type is formed proximate the first spacer structure while the semiconductor portion lateral to the second spacer structure is masked. The first impurity region and the semiconductor portion define a junction. A width of the second spacer structure is reduced while the second spacer structure and the first impurity region are masked. A second impurity region of the first conductivity type is formed in the semiconductor portion proximate the second spacer structure. The method provides a diode with reduced series resistance.

17 Claims, 3 Drawing Sheets

LATERAL DIODE WITH MULTIPLE SPACERS

BACKGROUND OF THE INVENTION

1. Field of the Invention

This invention relates generally to semiconductor processing, and more particularly to diodes and methods of making the same.

2. Description of the Related Art

Heat management plays a vital role in the process of designing most electrical devices. However, the microscopic geometries and tight electrical performance windows of integrated circuits present special challenges. Elevated chip operating temperatures impose constraints on the performance of the circuit in several ways. Chip operating temperature has a direct impact on the maximum available clocking speed and thus the overall speed performance of the integrated circuit. Furthermore, higher operating temperatures restrict the permissible operating voltage and ambient temperature environment of the chip. Lastly, chip life span is adversely impacted by higher operating temperatures. If the available mechanisms for integrated circuit heat dissipation cannot adequately handle the $I^2R$ heat propagation, compromises in the speed performance, the operating voltage, the applications and the design life span of the integrated circuit may have to be made.

A common method for monitoring chip temperature involves the use of an on-chip diode in conjunction with the remote diode temperature sensor. A conventional on-chip thermal diode consists of a forward biased pn junction. A conventional method of using this type of on-chip diode entails forcing two different currents through the diode, typically with a current ratio of about 10:1. The diode's voltage is measured at each current level and the temperature is calculated based on a diode equation as follows:

$$V_H - V_L = n\frac{kT}{q}\left(\ln\frac{I_H}{I_L}\right) \qquad \text{Equation 1}$$

where $I_H$ is the larger diode bias current, $I_L$ is the smaller diode bias current, $V_H$ is the diode voltage while $I_H$ is flowing, $V_L$ is the diode voltage while $I_L$ is flowing, n is the ideality factor of the diode, k is Boltzmann's constant ($1.38 \times 10^{-23}$ joules/K), T is the temperature in Kelvins and q is the charge of an electron ($1.60 \times 10^{-19}$ C). If $I_H/I_L$ is selected to be 10.0, Equation 1 simplifies to:

$$V_H - V_L = 1.986 \times 10^{-4} \cdot nT \qquad \text{equation 2}$$

Equation #2 may then be solved for the temperature T.

The accuracy of the temperature reading from the on-chip diode depends on the ideality n as well as the series resistance of the diode. The ideality factor n of the diode is a function of, inter alia, the character of the pn junction and the quality, that is, the defect level of the semiconductor body in which the pn junction is positioned. The series resistance is largely a factor of the resistance of the diode body, that is, the resistance of the semiconductor body between the pn junction and the grounded n-doped impurity region. In bulk silicon processing where vertical device isolation is provide by impurity wells, the pn junction is not bounded vertically and thus has both substantial vertical and horizontal components. Ideality factors approaching 1.0 can be readily achieved. In addition, in a bulk silicon device, the depth of the silicon body is such that the resistance thereof is relatively low such that errors introduced due to series resistance may be managed.

More recently introduced integrated circuits have been implemented on semiconductor-on-insulator substrates, which consist of a very thin silicon layer positioned on an underlying insulator. Active regions are circumscribed by trench isolation structures. The migration to semiconductor-on-insulator technology has introduced a set of challenges associated with implementing thermal on-chip diodes. To begin with, the island-like silicon active regions are relatively thin and thus have an inherently higher resistance than would be observed in a bulk silicon process. The higher series resistances can adversely affect the accuracy of the temperature readings from the diode. In addition, the pn junction that makes up the diode in a semiconductor-on-insulator substrate is often constrained vertically by the underlying insulator layer. Thus, the pn junction may consist primarily of a vertical component. If there are defects in the semiconductor layer, those defects combine with the much smaller size of the pn junction can lead to a higher than desired ideality factor.

One conventional on-chip diode design for silicon-on-insulator processing utilizes a ring-shaped gate electrode positioned on a silicon island. The gate electrode is rectangularly shaped with two long sides and two short sides. A rectangular-shaped p-type impurity region is positioned in the silicon island beneath and somewhat concentric with the gate. A ring-shaped n-type impurity region is positioned beneath and somewhat concentric with the gate. The rectangular-shaped p-type impurity region and the ring-shaped n-type region define a ring-shaped pn junction that positioned beneath but slightly offset from the footprint of the gate. The perimeter of the ring-shaped gate is circumscribed by two dielectric sidewall spacers. The two spacers are symmetrically positioned and shaped around the periphery of the gate.

The present invention is directed to overcoming or reducing the effects of one or more of the foregoing disadvantages.

SUMMARY OF THE INVENTION

In accordance with one aspect of the present invention, a method of manufacturing is provided that includes forming a gate structure on a semiconductor portion of a substrate. The semiconductor portion has a first conductivity type. First and second spacer structures are formed on opposite sides of the gate structure. A first impurity region of a second conductivity type is formed proximate the first spacer structure while the semiconductor portion lateral to the second spacer structure is masked. The first impurity region and the semiconductor portion define a junction. A width of the second spacer structure is reduced while the second spacer structure and the first impurity region are masked. A second impurity region of the first conductivity type is formed in the semiconductor portion proximate the second spacer structure.

In accordance with another aspect of the present invention, a method of manufacturing a diode is provided that includes forming a gate structure on a semiconductor portion of a substrate. The semiconductor portion has a first conductivity type. First and second spacer structures are formed on opposite sides of the gate structure. A first impurity region of a second conductivity type is formed proximate the first spacer structure while the semiconductor portion lateral to the second spacer structure is masked. The first impurity region and the semiconductor portion defined a pn junction. A width of the second spacer structure is reduced the second spacer structure and the first impurity region are masked. A second impurity region of the first conductivity type is formed in the semiconductor portion proximate the second spacer structure but in spaced-apart relation to the pn junction.

In accordance with another aspect of the present invention, a circuit device is provided that includes a substrate that has a semiconductor portion of a first conductivity type, and a gate structure on the semiconductor portion. First and second spacer structures are positioned on opposite sides of the gate structure. The second spacer structure is narrower than the first spacer structure. A first impurity region of a second conductivity type is in the semiconductor portion proximate the first spacer structure. The first impurity region and the semiconductor portion define a pn junction. A second impurity region of the first conductivity type is in the semiconductor portion proximate the second spacer structure but in spaced-apart relation to the pn junction.

In accordance with another aspect of the present invention, a diode is provided that includes a substrate that has a semiconductor portion with an n-type doping, and a gate structure on the semiconductor portion. First and second spacer structures are positioned on opposite sides of the gate structure. The second spacer structure is narrower than the first spacer structure. A p-type impurity region is in the semiconductor portion proximate the first spacer structure. The p-type impurity region and the semiconductor portion define a pn junction. An n-type impurity region is in the semiconductor portion proximate the second spacer structure but in spaced-apart relation to the pn junction.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
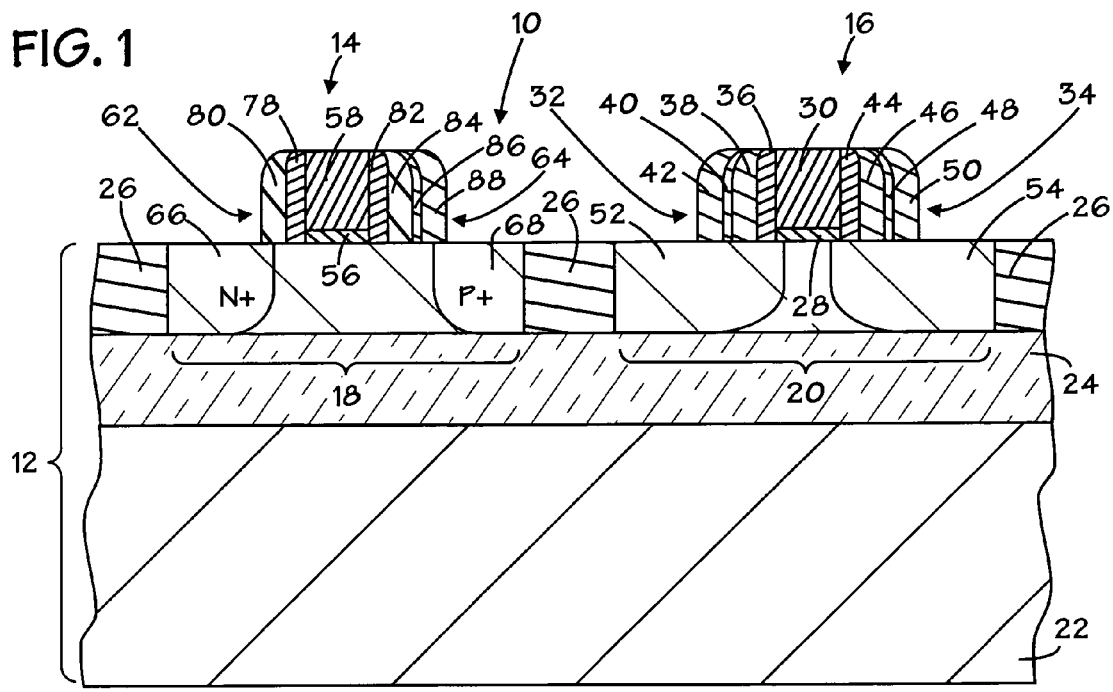
FIG. 1 is a cross-sectional view of an exemplary embodiment of an integrated circuit implemented on a substrate in accordance with the present invention.

In the drawings described below, reference numerals are generally repeated where identical elements appear in more than one figure. Turning now to the drawings, and in particular to FIG. 1, therein is depicted a cross-sectional view of an exemplary embodiment of an integrated circuit 10 implemented on a substrate 12. In an exemplary embodiment, the substrate is a semiconductor-on-insulator substrate. However, other substrates useful for integrated circuit fabrication may be used. The integrated circuit 10 consists of numerous circuit devices, two of which are shown and numbered 14 and 16. In an exemplary embodiment, the circuit device 14 is a diode and the circuit device 16 is a transistor. The circuit device 16 may be virtually any type of circuit device used in an integrated circuit. The diode 14 and the transistor 16 are implemented on respective active regions 18 and 20 that are composed of a suitable semiconductor substrate material, such as, for example, silicon, germanium, or the like. In an exemplary embodiment, the active regions 18 and 20 are composed of silicon.

The insulator portion of the semiconductor-on-insulator substrate 12 consists of a base substrate 22, an insulator film or substrate 24 positioned on the base substrate 22 and an insulating film 26 positioned on the insulator substrate 24. The base substrate 22 may be an insulator or a semiconductor as desired.

The insulator substrate 24 may be composed of well-known insulator materials, such as, for example, oxide, silicon nitride, sapphire, laminates of these or the like. The insulating film 26 may be composed of the same types of materials.

The insulator substrate 24 and the insulating film 26 subdivide the active regions 18 and 20 into semiconductor islands. That is, the active regions 18 and 20 are laterally and vertically electrically isolated by insulating material. The active regions 18 and 20 have some initial doping level of either p-type or n-type impurities. This initial doping may be provided by ion implantation, in-situ doping, diffusion or the like.

The structure of the circuit device 16 will now be described. A gate dielectric layer 28 is positioned on the active region 20 and a gate structure or electrode 30 is positioned on the gate dielectric layer 28. The stack consisting of the gate electrode 30 and the gate dielectric layer 28 are bracketed by respective spacer structures 32 and 34. The gate electrode 30 may be composed of a variety of conductor materials, such as, for example, doped polysilicon, copper, gold, silver, tungsten, alloys of these, refractory metal silicides or the like. In an exemplary embodiment, the gate electrode 30 is composed of doped polysilicon. The gate dielectric layer 28 may be composed of a variety on insulating materials, such as, for example, oxide, silicon nitride, silicon oxynitride, high or low-K dielectrics, laminates of these or the like.

The spacer structures 32 and 34 are advantageously composed of an insulating material or materials and may be unitary structures or composite structures as depicted in FIG. 1. The composite spacer structure 32 consists of spacers 36, 38, 40 and 42. The spacer structure 34 similarly consists of spacers 44, 46, 48 and 50. In an exemplary embodiment, the spacers 36 and 44 are composed of oxide, the spacers 38, 46, 42 and 50 are composed of silicon nitride and the spacers 40 and 48 are composed of oxide. The spacers 40 and 48 are used principally as an etch stop layer during the etch definition of the spacers 42 and 50. These materials are exemplary in that many different types of insulating materials, such as high-K dielectrics, low-K dielectrics, silicon oxynitride or other insulating materials may be used. Impurity regions 52 and 54 are provided in the active region beneath the gate electrode 30.

The impurity regions 52 and 54 are designed to function as source/drain regions and may be formed by ion implantation, diffusion or the like. The skilled artisan will appreciate that a source/drain region may function as a source or a drain depending how it is connected to interconnect structures. The impurity regions 52 and 54 may be n-type or p-type as desired, and may be formed with various p-type or n-type impurities, such as phosphorus, arsenic, boron, indium, antimony, $BF_2$ or the like.

The structure of the diode 14 will now be described in conjunction with FIG. 1 and FIG. 2, which is a higher magnification cross-sectional view of the diode 14. The diode 14 consists of a gate structure, in this example, in the form of a gate dielectric layer 56, a gate electrode 58 and an overlying conducting layer 60. Spacer structures 62 and 64 and impurity regions 66 and 68 formed in the active region 18. The gate dielectric layer 56 may be composed of a variety of materials suitable for gate dielectric layers such as oxide, silicon nitride, silicon oxynitride, high or low-K dielectrics, laminates of these or the like. The gate electrode 58 may be composed of a variety of materials such as doped polysilicon, copper, gold, silver, tungsten, alloys of these, refractory metal silicides or the like. The conductor layer 60 may be composed of a variety of conducting materials such as various metal suicides, gold, or the like.

The skilled artisan that the gate structure consisting of the gate dielectric layer 56, the gate electrode 58 and the conductor layer 60 need not be fabricated as a typical gate electrode stack since the principal purpose of the gate structure is to provide an overlying hard mask structure for masking of the underlying active region 18 during formation of the impurity regions 66 and 68. Accordingly, the dielectric layer 56, the gate electrode 58 and the conductor layer 60 could be replaced with a single unitary structure composed of virtually any material that may be integrated into a fabrication process and serve reliably as a hard mask. One benefit of implementing the gate stack as the insulator layer 56, the gate electrode 58 and the conductor layer 60 is that these structures match well with the myriad of other types of transistor structures that are fabricated on the integrated circuit 10 and thus facilitate process integration.

The active region 18 is advantageously provided with some initial doping of a particular conductivity type, that is, n-type or p-type. In the exemplary embodiment illustrated, the active region 18 is provided with initial n-type doping and thus defines an N-region as shown. In order to implement the diode functionality of the diode 14, a pn or np junction is established in the active region 18. This may be accomplished by forming one or other of the impurity regions 66 or 68 with an impurity that has the opposite conductivity type to the active region 18. In an exemplary embodiment, the impurity region 68 is implemented as a p-type or p+ impurity region such that the impurity region 68 and the active region 18 define a pn junction 70. With the impurity region 68 implemented as a p+ region, the impurity region 66 is implemented as an impurity region with the same conductivity type as the active region 18, in this case as a n-type region or n+ region.

The lateral border of the impurity region 66 is illustrated by the line 72. The lateral border 72 is not a junction in the classic sense, but rather represents the approximate post-anneal position of the lateral extent of the relatively higher-concentration impurity region 66. As noted above in the Background section hereof, the resistance of a pn junction diode is determined in large part by the series resistance associated with the semiconductor body, which in this case is represented by the length $L_{New}$ of the active region 18 between the pn junction 70 and the lateral boundary 72. Generally, as $L_{new}$ is shortened, the series resistance of the diode 14 decreases and the accuracy of thermal readings taken from the diode 14 increase. The diode 14 is fabricated in accordance with the present invention in a way that reduces the length between the pn junction 70 and the lateral boundary 72 and thus the series resistance of the diode 14 over that provided by conventional diode processing. This improvement is accomplished in large part by making the spacer structures 62 and 64 asymmetric in lateral width so that the lateral boundary 72 of the impurity region 66 is positioned closer to the gate electrode 58 than would be permitted if the spacer structure 62 and 64 were symmetrically formed.

The conventional process is illustrated by the dashed lines 74 and 76. The dashed line 74 represents the lateral projection of the spacer structure 62 if it were fabricated symmetrically with the spacer structure 64. The dashed line 76 represents the lateral boundary of the impurity region 66 if formed using the symmetric version of the spacer structure 62, as represented by the dashed line 74, as an implant mask. Note that the length $L_{conventional}$ between the pn junction 70 and the dashed line 76 is longer than the length $L_{new}$ obtained using the process in accordance with the present invention and thus represents a higher series resistance for a conventionally produced diode and thus more errors introduced into temperature readings from the diode 14, if conventionally produced.

Figure 2:
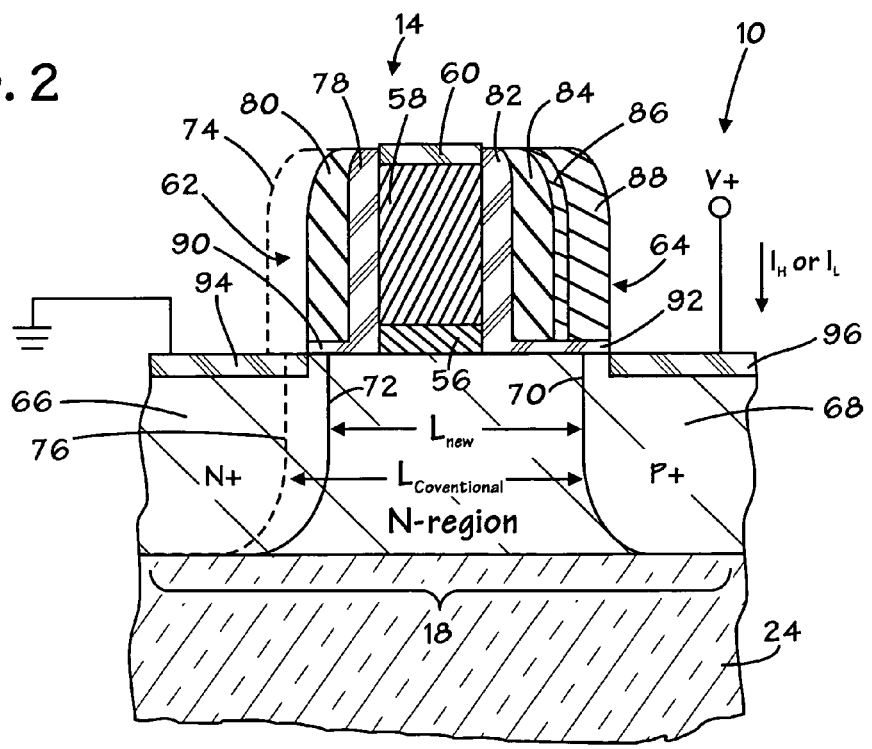
FIG. 2 is a magnified portion of the cross-sectional view depicted in FIG. 1 in accordance with the present invention.

The spacer structures 62 and 64 may be composed of unitary structures, that is, one spacer on each side of the gate electrode 58 or composite structures as depicted in FIG. 2. Again, the composite nature of the spacer structures 62 and 64 may be advantageous from a process integration standpoint where multiple spacer processes are used to fabricate other structures on the integrated circuit 10. Thus, the spacer structure 62 may consist of a spacer 78 and a spacer 80. The spacer structure 64 may consist of spacers 82, 84, 86 and 88. Depending upon the materials selected for the various spacers for the spacer structures 62 and 64, there may be horizontal ledges 90 and 92 that consist of portions of the material used to form the spacers 78, 82 and 86. Low resistance conductor structures 94 and 96 may be formed on the impurity regions 66 and 68 in order to facilitate interconnect with other conductors. The conductors 94 and 96 may be formed from the same materials as the conductor 60.

In operation, the impurity region 68 is connected to a voltage source, V+, and the impurity region 66 is connected to ground. A high current, $I_H$, and a low current, $I_L$, are sequentially pumped across the pn junction 70 and the voltage drop across the diode 14 for each current is measured for purposes of determining a temperature of the integrated circuit 10 using Equation 2 shown above.

Figure 3:
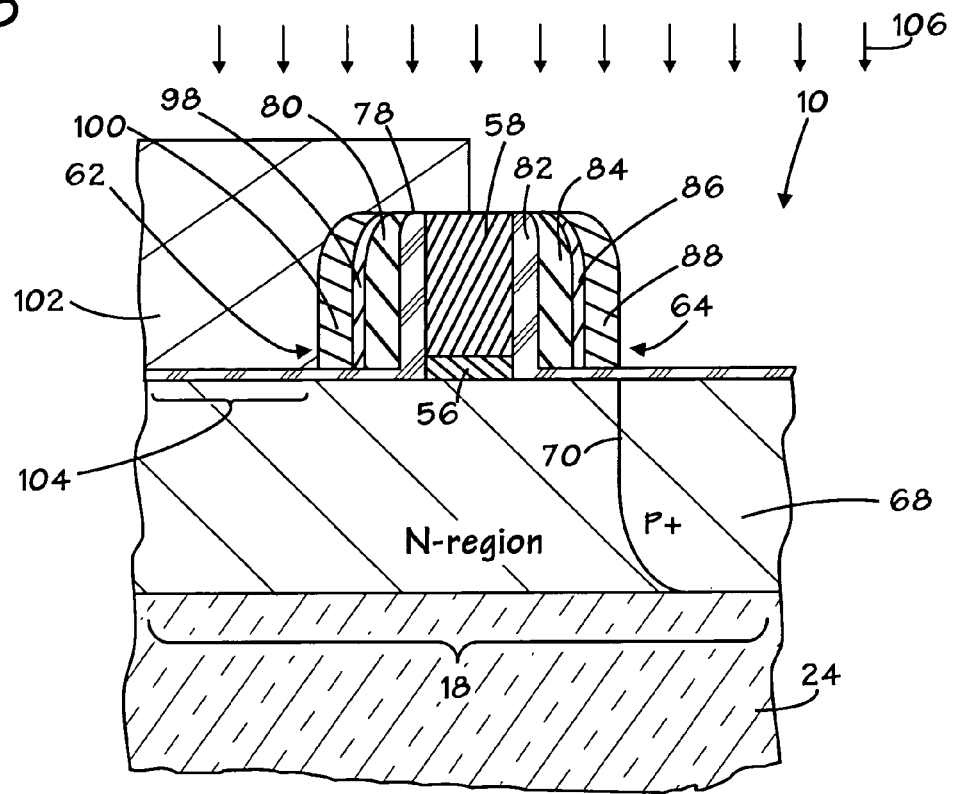
FIG. 3 is a cross-sectional of the substrate of FIG. 1 depicting formation of an impurity region in accordance with the present invention.
Figure 4:
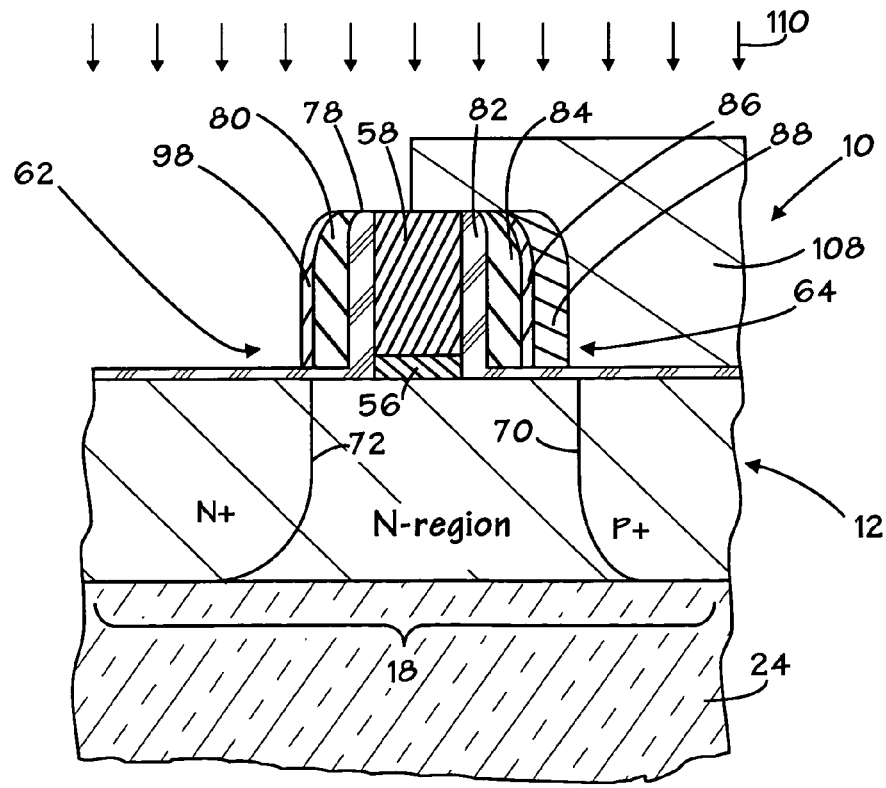
FIG. 4 is a cross-sectional like FIG. 3 depicting formation of another impurity region in accordance with the present invention.
Figure 5:
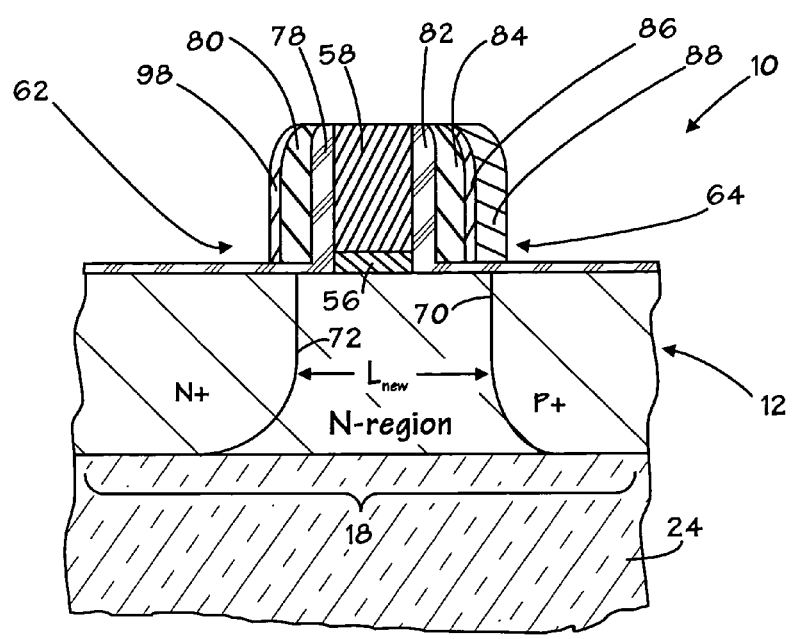
FIG. 5 is a cross-sectional view like FIG. 4 depicting annealing of the substrate in accordance with the present invention.

An exemplary process flow for fabricating the diode 14 in accordance with the present invention may be understood by referring now to FIGS. 3, 4 and 5 and initially to FIG. 3. Initially, the gate structure, consisting of the gate dielectric layer 56 and the gate electrode 58, is formed on the active region 18. The gate dielectric layer 56 and the gate electrode 58 may be formed using well-known material deposition, lithography and etching techniques. As noted elsewhere herein, the materials selected for the gate dielectric layer 56 and the gate electrode 58 may be any of a myriad of material suitable for hard masking the active region 18. In an exemplary embodiment, the gate dielectric layer 56 may be composed of oxide and the gate electrode may be composed of poly silicon. The spacer structures 62 and 64 may be fabricated using well-known material deposition and removal techniques. For example, if the spacer structures 62 and 64 are implemented as unitary, that is, single layer, structures, a material layer may be applied or formed over the gate electrode 58 and subsequently patterned using etching, laser oblation or other well-known material removal techniques. The same is true if the spacer structures 62 and 64 are implemented as multiple, that is, composite structures as shown in FIG. 3. Thus, the spacers 78 and 82 may be formed by material deposition or formation and subsequent material removal and so on and so forth for the remaining spacers 80 and 84, 98 and 86, and 100 and 88. Note that the spacers 98 and 100 of the spacer structure 62 are present at this stage but will be subsequently removed as described below. The spacers 98 and 86 are provided largely as etch stop layers so that the etch definition of the spacers 100 and 88 will not unduly attack the spacers 80 and 84 or underlying substrate. The spacers 98 and 86 need not be used in the event that the material layer selected to form the spacers 100 and 88 may be etched selectively to the spacers 80 and 84.

With the spacer structures 62 and 64 in place, a mask 102 is formed at least over the portion 104 of the active region 18 lateral to the spacer structure 62. The mask 102 may be fabricated to overlie the gate electrode 58 as well as shown. The mask 102 may be composed of resist, hard mask materials or the like.

With the mask 102 in place, the p+ impurity region 68 may be formed by ion implantation, diffusion or the like. In an exemplary embodiment, the impurity region 68 is formed by ion implantation of p-type impurity ions 106. In an exemplary embodiment, boron, $B_{11}$, may be implanted at an energy of about 2 to 10 Kev, a dosage of about 1E14 to 3E15 $cm^{-2}$ and 0° implant angle. The initial position of the p-n junction 72 will be roughly aligned with the edge of the gate structure 64. The mask 102 is then stripped by ashing, solvent stripping, combinations of these or the like.

Referring now to FIG. 4, a mask 108 is formed on the substrate 12 such that at least the impurity region 68 is masked. The mask 108 may also extend over the gate electrode 58 as shown. At this point, the width of the spacer structure 62 is reduced by removing the spacer 100. In an exemplary embodiment, the spacer 100 is etched away down to the spacer 98 that serves as an etch stop. Note, however, that if the spacer structure 62 were fabricated from a unitary or a structure consisting of less than four spacers, the width reduction may be accomplished by etching or other material removal of whatever structure(s) that makes up the spacer structure. Thus for example, if the spacer structure 62 were composed of a single spacer, an etch trim may be performed to reduce the width thereof. In the illustrated embodiment, the spacer 100 is composed of silicon nitride and thus may be removed by well-known plasma or wet etching techniques suitable for silicon nitride. In an exemplary embodiment, the spacer 100 may be removed by anisotropic etching using $CF_4$ and HBr.

Following the trim of the spacer structure 62, the impurity region 66 is formed in the active region 18 by ion implantation, diffusion or the like. In an exemplary embodiment, the impurity region 66 is formed by implantation of n-type ion 110. The mask 108 may be used for both the trim of the spacer structure 62 and the implantation of the ions 110. Optionally, a new and separate mask may be applied prior to the implant of the ions 110. The implant may be performed using arsenic at an energy of about 2 to 10 Kev and a dosage of about 1E15 to 3E15 $cm^{-2}$ and a 0° angle. The initial position of the lateral boundary 72 of the impurity region 66 will be approximately self-aligned to the spacer 98. Following the implant of the ions 110, the mask 108 may be stripped by ashing solvent stripping, or the like.

Referring now to FIG. 5, an anneal is performed to activate the impurity regions 66 and 68. The anneal may be a rapid thermal anneal, a spike rapid thermal anneal, or a furnace process as desired. In an exemplary embodiment, the anneal is a rapid thermal anneal performed to about 1000 to 1100° C. for about 10 to 60 seconds. The anneal produces a lateral migration of the pn junction 70 and the lateral boundary 72 and results in the advantageous length, $L_{new}$, between the pn junctions 70 and the lateral boundary 72. At this point, at least the portions of the spacers 98 and 86 may be removed in anticipation of a subsequent salicidation process to produce the conductor structures 94, 96 and 60 that are depicted in FIG. 2.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A circuit device, comprising:
    a substrate having a semiconductor portion of a first conductivity type;
    a gate structure on the semiconductor portion;
    first and second spacer structures on opposite sides of the gate structure, the second spacer structure being narrower than the first spacer structure;
    a first impurity region of a second conductivity type in the semiconductor portion proximate the first spacer structure, the first impurity region and the semiconductor portion defining a pn junction; and
    a second impurity region of the first conductivity type in the semiconductor portion proximate the second spacer structure but in spaced-apart relation to the pn junction.

2. The circuit device of claim 1, wherein the substrate comprises a semiconductor-on-insulator substrate.

3. The circuit device of claim 1, wherein the semiconductor portion comprises silicon.

4. The circuit device of claim 1, wherein the first spacer structures comprises first, second, third and fourth spacers and the second spacer structure comprises fifth and sixth spacers.

5. The circuit device of claim 1, wherein the first conductivity type comprises n-type and the second conductivity type comprises p-type.

6. The circuit device of claim 1, wherein the second impurity region has a lateral boundary positioned closer to the gate structure than the pn junction.

7. The circuit device of claim 1, comprising a conductor coupled to the gate structure and the second impurity region.

8. The circuit device of claim 7, wherein the gate structure is grounded.

9. The circuit device of claim 1, comprising a transistor on the substrate.

10. A diode, comprising:
    a substrate having a semiconductor portion with an n-type doping;
    a gate structure on the semiconductor portion;
    first and second spacer structures on opposite sides of the gate structure, the second spacer structure being narrower than the first spacer structure;
    a p-type impurity region in the semiconductor portion proximate the first spacer structure, the p-type impurity region and the semiconductor portion defining a pn junction; and
    an n-type impurity region in the semiconductor portion proximate the second spacer structure but in spaced-apart relation to the pn junction.

11. The diode of claim 10, wherein the substrate comprises a semiconductor-on-insulator substrate.

12. The diode of claim 10, wherein the semiconductor portion comprises silicon.

13. The diode of claim 10, wherein the first spacer structures comprises first, second, third and fourth spacers and the second spacer structure comprises fifth and sixth spacers.

14. The diode of claim 10, wherein the second impurity region has a lateral boundary positioned closer to the gate structure than the pn junction.

15. The diode of claim 10, comprising a conductor coupled to the gate structure and the n-type impurity region.

16. The diode of claim 15, wherein the gate structure is grounded.

17. The diode of claim 10, comprising a transistor on the substrate.

* * * * *